United States Patent [19]

Khoe et al.

[11] 4,427,261
[45] Jan. 24, 1984

[54] OPTICAL TRANSMISSION SYSTEM HAVING REDUCED MODAL NOISE

[75] Inventors: Giok D. Khoe; Christiaan H. F. Velzel, both of Eindhoven, Netherlands

[73] Assignee: U.S. Philips Corporation, New York, N.Y.

[21] Appl. No.: 282,618

[22] Filed: Jul. 13, 1981

[30] Foreign Application Priority Data

Aug. 6, 1980 [NL] Netherlands .................... 8004472

[51] Int. Cl.³ .............................................. G20B 5/14
[52] U.S. Cl. ................................. 350/96.20; 372/108
[58] Field of Search ............ 372/43; 350/96.15, 96.19, 350/96.20

[56] References Cited

U.S. PATENT DOCUMENTS

| | | | |
|---|---|---|---|
| 4,143,940 | 3/1979 | Khoe | 350/96.15 |
| 4,286,232 | 8/1981 | Puech et al. | 350/96.15 |
| 4,325,605 | 4/1982 | Winzer et al. | 350/96.15 |
| 4,351,585 | 9/1982 | Winzer et al. | 350/96.15 |

FOREIGN PATENT DOCUMENTS 2083646  3/1982  United Kingdom ............ 350/96.20

OTHER PUBLICATIONS

Yamaoka et al., "Fiber Mounted Semiconductor Devices for Optical Communication Systems", Fujistsu Labs. Ltd., Kawasaki Japan, 1975.

*Primary Examiner*—William L. Sikes
*Assistant Examiner*—Leon Scott, Jr.
*Attorney, Agent, or Firm*—Thomas A. Briody; Robert T. Mayer; Steven R. Biren

[57] ABSTRACT

An optical fiber (5) is coupled to an end face (5) of a semiconductor laser diode and the other end face is coupled to one end of a monomode optical waveguide. The other end of waveguide is terminated in a reflecting manner, e.g. by mirror, to reduce the coherence length of the laser. Thus, so-called "speckle patterns" are only produced in the transmission fiber over a short distance from the laser and modal noise further on in the transmission fiber can be prevented by avoiding the use of non-ideal fiber couplings or other connections having a spatial filter effect within this short distance from the laser.

2 Claims, 3 Drawing Figures

OPTICAL TRANSMISSION SYSTEM HAVING REDUCED MODAL NOISE

BACKGROUND OF THE INVENTION

The invention relates to an arrangement comprising a semiconductor laser diode in which one of the end faces is adapted to be coupled to an optical transmission waveguide.

When a semiconductor laser diode having a large coherence length is coupled to a glass fiber having a graded refractive index profile or, in general, to a multimode fiber and if there are one or more non-ideal fiber couplings or, in general, connections having a spatial filter action in the transmission path, then what is commonly known as modal noise is produced at the receiving end of the fiber.

The modal noise phenomenon is described in the Proceedings of the Fourth European Conference on Optical Communication, Sept. 12–15, 1978, Genova, pages 492–501. It is also mentioned there that the use of a laser which has a larger spectral line width of one longitudinal mode (and consequently a smaller coherence length) can greatly reduce the modal noise.

SUMMARY OF THE INVENTION

An object of the invention is to provide an arrangement comprising a semiconductor laser diode having an inherently small spectral line width of one longitudinal mode, but which can produce an optical spectrum suitable for reducing the modal noise in fiber transmission systems.

According to the invention, an arrangement comprising a semiconductor laser diode of which one of the end faces is adapted to be coupled to an optical transmission waveguide is characterized in that the other end face of the semiconductor laser diode is optically coupled to one end of a section of a monomode optical waveguide, the other end of said last waveguide being terminated in an at least partially reflecting manner.

DESCRIPTION OF THE PREFERRED EMBODIMENTS

Figure 1:
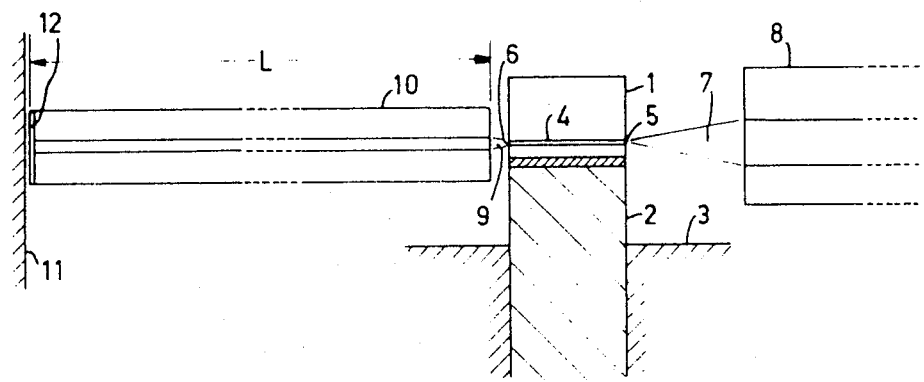
FIG. 1 shows a semiconductor laser diode arrangement in accordance with the invention.

FIG. 1 shows a multilayer-type semiconductor laser diode 1 mounted on a heat sink 2 which is fitted in a holder 3. The active layer 4 of the laser is located between the reflecting end faces 5 and 6, these end faces forming the laser resonator. The end faces 5 and 6 are semitransparent mirrors which transmit a portion of the incident light.

By means of a coupling 7 the light transmitted by the end face 5 is coupled to the core of transmission fiber 8, for example a fiber having a graded refractive index profile, which forms the beginning of a (long-distance) transmission system.

Figure 2:
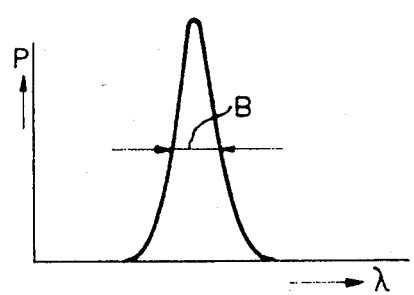
FIGS. 2 and 3 show graphs of optical power as a function of wavelength.

For a good quality laser the optical power P of the laser as a function of wavelength λ may have the form shown in FIG. 2. In practice it has been found, as mentioned above, that when such a laser is coupled to a multimode fiber modal noise is produced at the receiving end of the optical transmission system. A laser having a small spectral line width B and consequently a large coherence length may produce in the transmission fiber at large distances from the laser time-varying intensity distributions over the fiber cross-section. This may result, after a non-ideal fiber coupling, in intensity modulation of the optical signal. Because of their shape, these intensity distributions are called speckle patterns.

In order to reduce the modal noise in the transmission system, the end face 6 of the laser is optically coupled by means of an optical coupling 9 to one end of a section of a monomode optical waveguide in the form of a fiber 10, the other end of which is terminated in a reflecting manner by a mirror 11.

Figure 3:
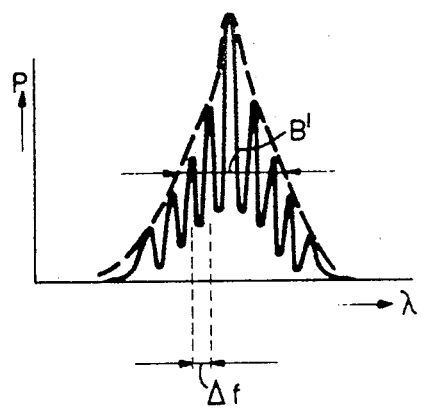

A portion of the laser light transmitted by the end face 6 of the laser is coupled by means of coupling 9 into the monomode fiber 10 and is returned to the laser after reflection at mirror 11. So the monomode fiber 10 forms an external optical feedback path for the laser. As a result thereof the spectral line width B' of the laser increases and it appears that the fine-structure of a mode consists of a plurality of resonances at a mutual distance Δf, for which it holds approximately that:

$$\Delta f = V_g/2L.$$

where Vg denotes the group velocity of the emitted light in the fiber 10 and L the length of the fiber 10. The optical power P as a function of the wavelength λ will be of the shape shown in FIG. 3 when the external optical feedback is used.

Experiments have proven that it is essential that the light propagate in only one mode in fiber 10, as otherwise phase fluctuations may be produced in the light reflected by the fiber 10 to the laser, which may produce additional noise in the optical output of the laser diode.

In an alternative embodiment, the mirror 11 may be replaced by a reflecting layer 12 provided on the end of the fiber 10. Alternatively, it is possible to couple the end of the fiber to a silicon photo-diode which can function as a monitor, partial reflection occurring at the fiber-diode junction. Both measures may be combined if the reflecting layer 12 is made semi-transparent.

The coupling between the laser 1 and the monomode fiber 10 can be realized as described, for example, in the Proceedings of the First European Conference on Optical Fiber Communication, Sept. 16th–18th, 1975, London, pages 114–6 (Khoe).

In a further alternative embodiment, not shown in the figures, an integrated planar monomode optical waveguide may be used instead of monomode fiber 10. Coupling a laser diode to such a waveguide is described in, for example, Applied Optics, Volume 19, June 1980, pages 1847–52.

The wider spectral line width of one longitudinal mode of the laser diode is accompanied by a smaller coherence length, as is demonstrated in, for example, IEEE Journal of Quantum Electronics, volume QE-15, August 1979, pages 782–6 (Velzel et al). This limits the occurrence of speckle patterns to a small distance from the laser. If the external optical feedback were not used, these patterns may occur for a distance of some kilometers in the case of a graded index fiber. The use of the invention makes it possible to reduce the distance over which speckles may be produced in the transmission fiber to one or a few meters, depending on the permissible increase in the dispersion. Within this short distance non-ideal fiber couplings or other connections having a spatial filter effect should not be used. Modal noise further on in the transmission fiber is then prevented from occurring. In a practical embodiment a monomode fiber 10 having a core diameter of 6 microns, a V-number of 2.2 and a length L=50 mm was used and the coupling efficiency of coupling 9 was approximately 15%. However, none of these parameters appeared to have a critical value.

What is claimed is:

1. An optical transmission system having reduced modal noise, which comprises:

a semiconductor laser diode having first and second end faces, said first laser end face being coupled to an optical transmission waveguide during operation of the system; and a section of a monomode optical waveguide having first and second ends, said second laser end face being optically coupled to said first waveguide end and said second waveguide end being terminated in an at least partially reflective manner.

2. An optical transmission system as in claim 1, wherein the second end of said monomode optical waveguide comprises an at least partially reflective layer.

* * * * *